US009065444B2

(12) United States Patent
Chang et al.

(10) Patent No.: US 9,065,444 B2
(45) Date of Patent: Jun. 23, 2015

(54) POWER-UP INITIAL CIRCUIT (75) Inventors: Yen-An Chang, Miaoli County (TW); Hao-Jan Yang, Yun-Lin County (TW); Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 467 days.

(21) Appl. No.: 13/557,235

(22) Filed: Jul. 25, 2012

(65) Prior Publication Data
US 2013/0033250 A1    Feb. 7, 2013

Related U.S. Application Data (60) Provisional application No. 61/515,327, filed on Aug. 5, 2011.

(51) Int. Cl.
*G05F 1/00*    (2006.01)
*H03K 17/16*   (2006.01)

(52) U.S. Cl.
CPC ...... *H03K 17/162* (2013.01); *H03K 2217/0081* (2013.01)

(58) Field of Classification Search
CPC .................................. G05F 3/16; H03K 17/162
USPC .......... 323/223, 225, 268, 271, 282; 327/142, 327/143, 162, 163
See application file for complete search history.

(56) References Cited

U.S. PATENT DOCUMENTS

| | | | | |
|---|---|---|---|---|
| 5,861,772 A | * | 1/1999 | Lee | 327/589 |
| 6,084,454 A | * | 7/2000 | Holst | 327/198 |
| 6,204,704 B1 | * | 3/2001 | Williams et al. | 327/143 |
| 7,282,956 B2 | | 10/2007 | Lee | |
| 7,616,032 B2 | * | 11/2009 | Jang | 327/143 |
| 2014/0292380 A1 | * | 10/2014 | YI et al. | 327/109 |

FOREIGN PATENT DOCUMENTS

| | | |
|---|---|---|
| CN | 1787372 A | 6/2006 |
| CN | 1838325 A | 9/2006 |

* cited by examiner

*Primary Examiner* — Matthew Nguyen
(74) *Attorney, Agent, or Firm* — Winston Hsu; Scott Margo (57) ABSTRACT A power-up initial circuit includes a power-up control unit, a first switch and a second switch. The power-up control unit is used for receiving a high voltage start-up signal, and generating a first power-up control signal. The first switch has a first terminal for receiving an external voltage, a second terminal for coupling to the power-up control circuit for receiving the first power-up control signal, and a third terminal. The second switch has a first terminal coupled to the third terminal of the first switch, a second terminal for coupling to the power-up control circuit for receiving the first power-up control signal, and a third terminal for coupling to a high voltage generator.

17 Claims, 9 Drawing Sheets

| State | 1 | 2 | 3 |
|---|---|---|---|
| VHES | VL | VH | VH |
| 204 | Turning-on | Turning-off | Turning-off |
| B | VEXT | Floating | Floating |
| 206 | Turning-on | Turning-off | Turning-off |
| A | VEXT | VEXT' | VIH |
| FPCS | VL' | VH' | VH' |

| State | 1 | 2 | 3 |
|---|---|---|---|
| VHES | VL | VH | VH |
| 204 | Turning-on | Turning-off | Turning-off |
| B | VEXT | VINT | VINT |
| 206 | Turning-on | Turning-off | Turning-off |
| 510 | Turning-off | Turning-on | Turning-on |
| A | VEXT | VEXT' | VIH |
| FPCS | VL' | VH' | VH' |
| SPCS | VH' | VL' | VL' |

POWER-UP INITIAL CIRCUIT

CROSS REFERENCE TO RELATED APPLICATIONS

This application claims the benefit of U.S. Provisional Application No. 61/515,327, filed on Aug. 5, 2011 and entitled "Novel Power-up Initial Circuit," the contents of which are incorporated herein by reference.

BACKGROUND OF THE INVENTION

1. Field of the Invention

The present invention relates to a power-up initial circuit, and particularly to a power-up initial circuit that not only can increase a power-up capability, but can also reduce a side effect or a latch-up effect not wanted by a user.

2. Description of the Prior Art

Figure 1:
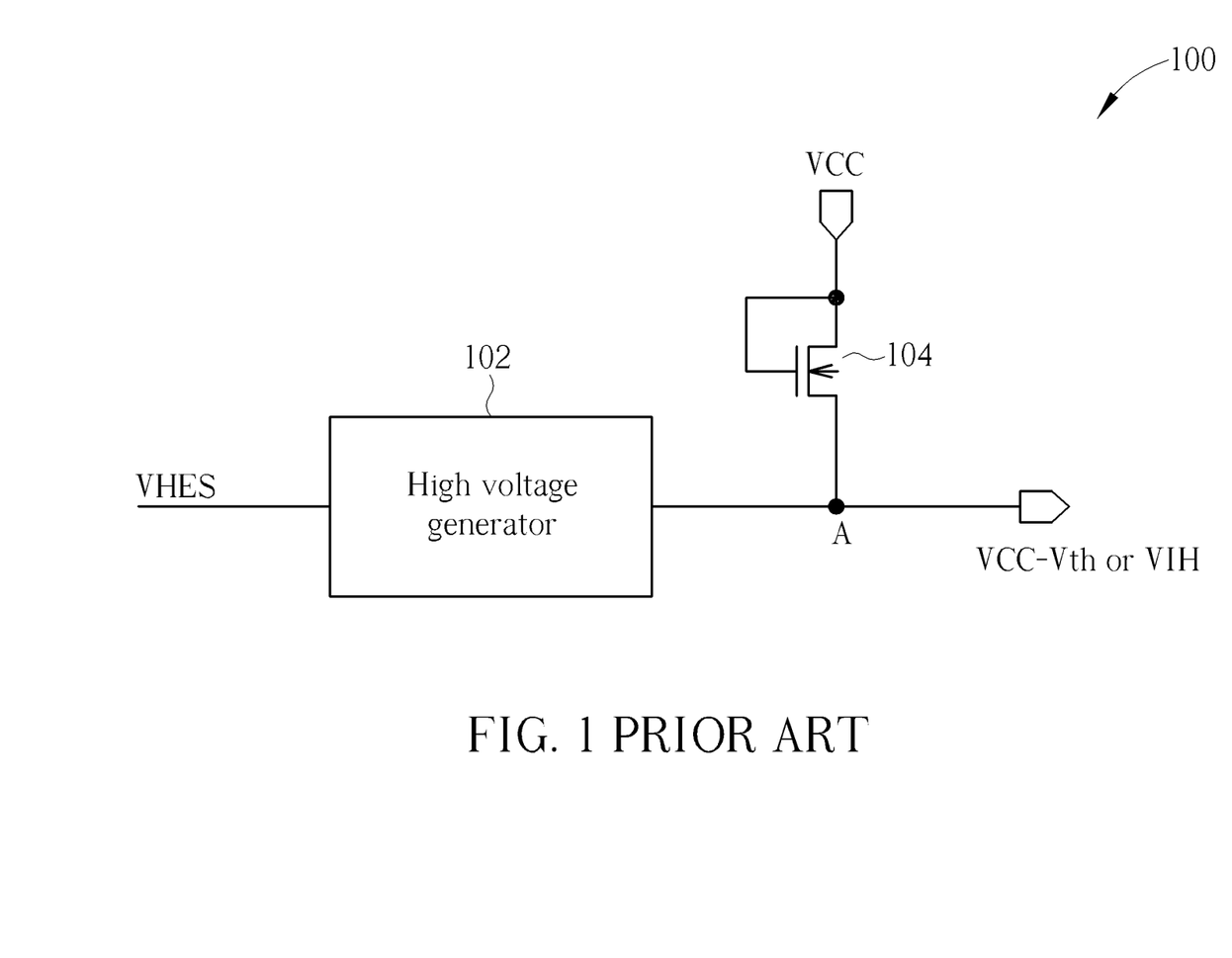
FIG. 1 is a diagram illustrating a power-up initial circuit according to the prior art.

Please refer to FIG. 1. FIG. 1 is a diagram illustrating a power-up initial circuit 100 according to the prior art. When a high voltage start-up signal VHES does not start up a high voltage generator 102, the power-up initial circuit 100 utilizes an N-type metal-oxide-semiconductor transistor 104 to fix a voltage of a node A at a voltage VCC-Vth, where VCC is an internal supply voltage, Vth is a threshold voltage of the N-type metal-oxide-semiconductor transistor 104, and the high voltage start-up signal VHES is generated by a power-up circuit. When the high voltage start-up signal VHES stars up the high voltage generator 102, the high voltage generator 102 generates an internal high voltage VIH, where the internal high voltage VIH is higher than the voltage VCC-Vth.

In an advanced metal-oxide-semiconductor transistor process, the internal supply voltage VCC is gradually reduced with an advance of the metal-oxide-semiconductor transistor process, so the voltage VCC-Vth is also gradually reduced. Because the voltage VCC-Vth is gradually reduced, a power-up capability of the power-up initial circuit 100 is reduced, and the power-up initial circuit 100 may exhibit a side effect or a latch-up effect not wanted by a user. Therefore, the power-up initial circuit 100 is not a good power-up initial circuit for the user.

SUMMARY OF THE INVENTION

An embodiment provides a power-up initial circuit. The power-up initial circuit includes a power-up control unit, a first switch, and a second switch. The power-up control unit is used for receiving a high voltage start-up signal, and generating a first power-up control signal. The first switch has a first terminal for receiving an external voltage, a second terminal coupled to the power-up control unit for receiving the first power-up control signal, and a third terminal. The second switch has a first terminal coupled to the third terminal of the first switch, a second terminal coupled to the power-up control unit for receiving the first power-up control signal, and a third terminal for coupling to a high voltage generator.

The present invention provides a power-up initial circuit. The power-up initial circuit utilizes a power-up control unit to determine turning-on and turning-off of a first switch and a second switch, or turning-on and turning-off of the first switch, the second switch, and a third switch, and utilizes turning-on and turning-off of a high voltage generator to control a voltage of a third terminal of the second switch. Therefore, compared to the prior art, a power-up capability of the present invention can not be reduced with decrease of an external voltage (the external voltage is decreased with an advanced metal-oxide-semiconductor transistor process), and the present invention can also not exhibit a side effect or a latch-up effect not wanted by a user.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
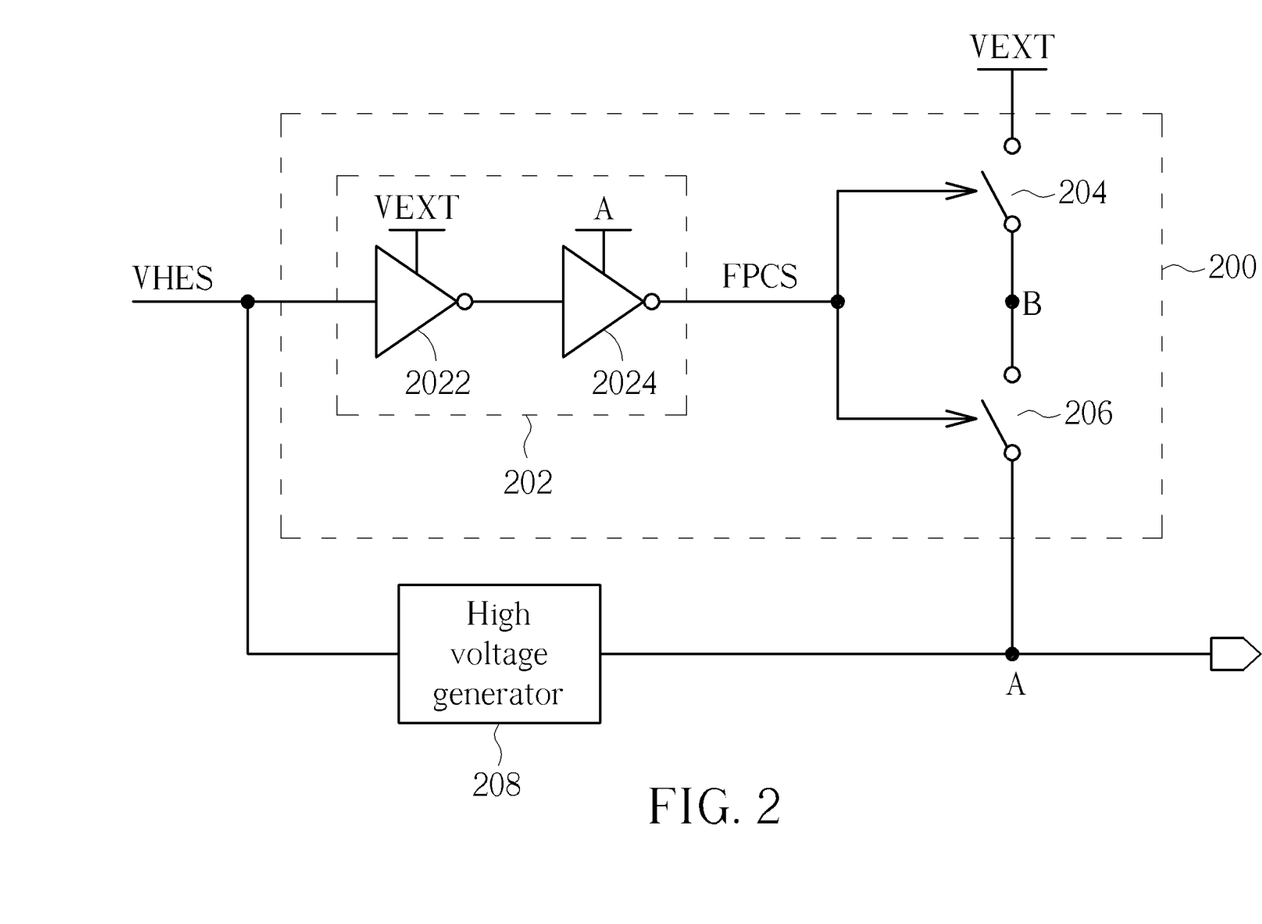
FIG. 2 is a diagram illustrating a power-up initial circuit according to an embodiment.
Figure 3:
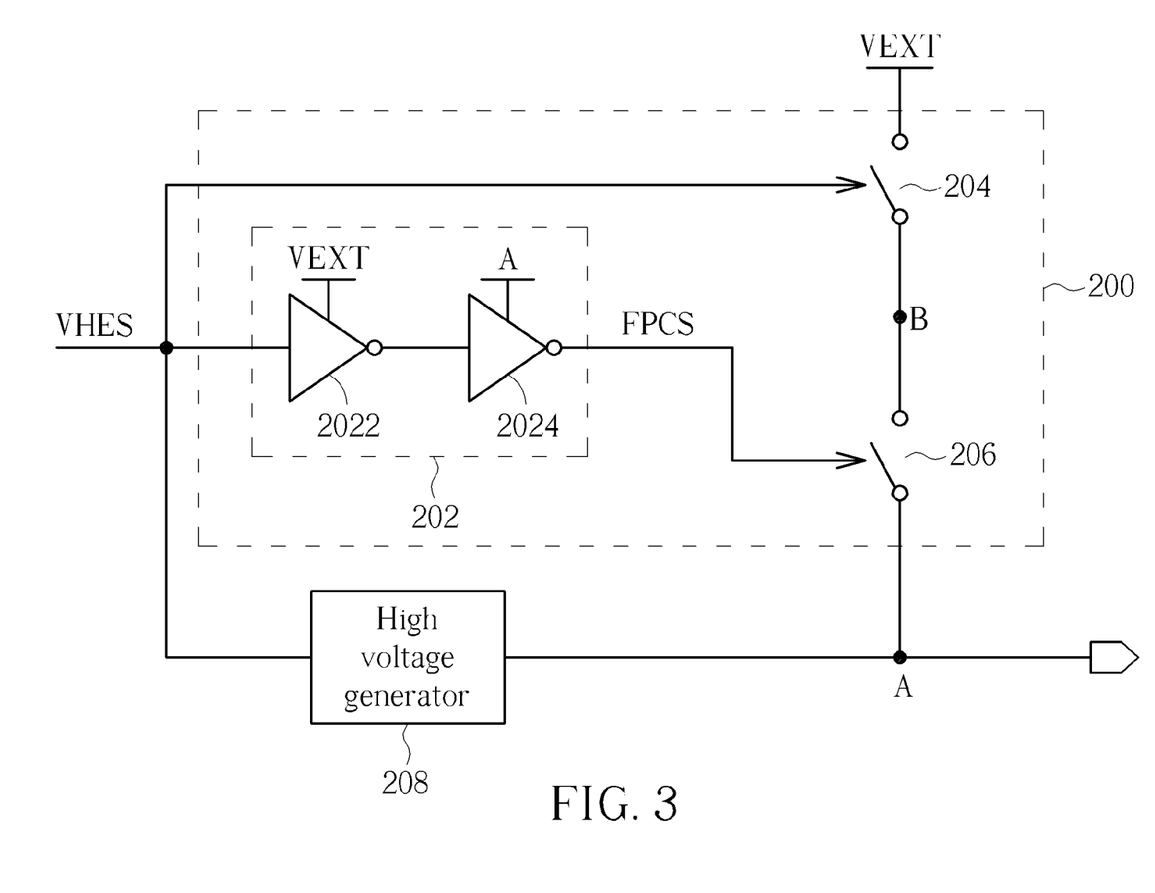
FIG. 3 is a diagram illustrating a power-up initial circuit according to another embodiment.

Please refer to FIG. 2. FIG. 2 is a diagram illustrating a power-up initial circuit 200 according to an embodiment. The power-up initial circuit 200 includes a power-up control unit 202, a first switch 204, and a second switch 206. The power-up control unit 202 is used for receiving a high voltage start-up signal VHES, and generating a first power-up control signal FPCS, where the high voltage start-up signal VHES is generated by a power-up circuit. The first switch 204 has a first terminal for receiving an external voltage VEXT, a second terminal coupled to the power-up control unit 202 for receiving the first power-up control signal FPCS, and a third terminal. The second switch 206 has a first terminal coupled to the third terminal of the first switch 204, a second terminal coupled to the power-up control unit 202 for receiving the first power-up control signal FPCS, and a third terminal coupled to a high voltage generator 208, where the high voltage generator 208 is further used for receiving the high voltage start-up signal VHES. The first switch 204 and the second switch 206 can be P-type metal-oxide-semiconductor transistors. But, the present invention is not limited to the first switch 204 and the second switch 206 being P-type metal-oxide-semiconductor transistors. That is to say, the first switch 204 and the second switch 206 can be N-type metal-oxide-semiconductor transistors or transmission gates. As shown in FIG. 2, the power-up control unit 202 includes a first inverter 2022 and a second inverter 2024. A voltage source of the first inverter 2022 is the external voltage VEXT, and a voltage source of the second inverter 2024 is a voltage of a node A, where the voltage of the node A is the same as an output voltage of the high voltage generator 208. The first inverter 2022 has a first terminal for receiving the high voltage start-up signal VHES, and a second terminal. The second inverter 2024 has a first terminal coupled to the second terminal of the first inverter 2022, and a second terminal coupled to the second terminal of the first switch 204 and the second terminal of the second switch 206 for outputting the first power-up control signal FPCS. As shown in FIG. 3, the second terminal of the first switch 204 can be directly coupled to the high voltage start-up signal VHES according to another embodiment. That is to say, the high voltage start-up signal VHES can be regarded as a part of the power-up control unit 202.

Figure 4:
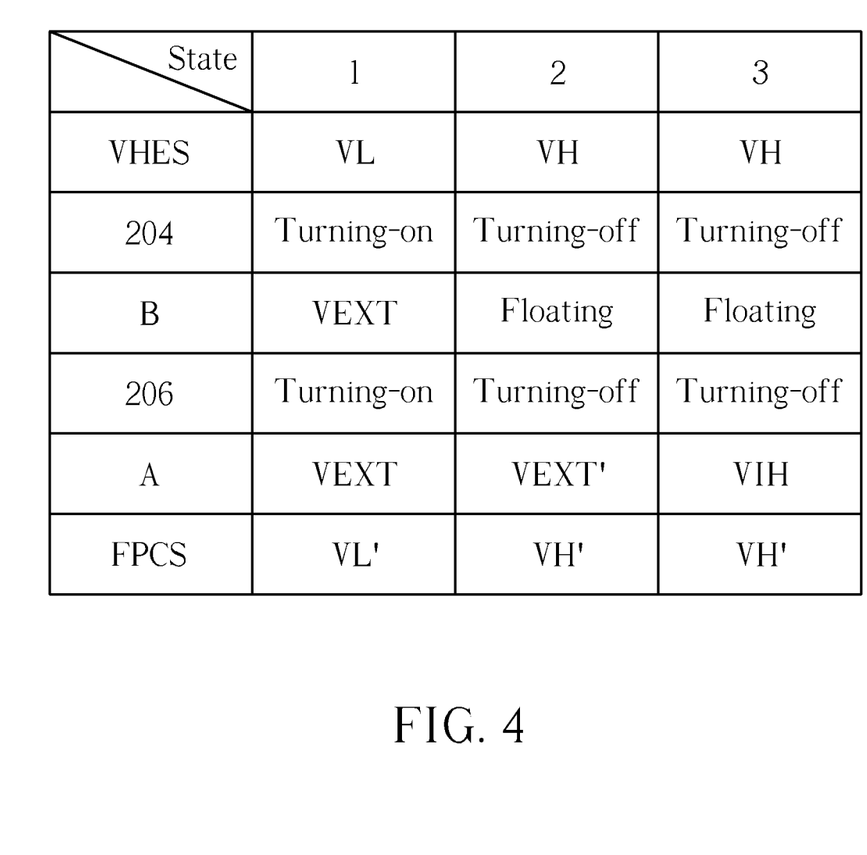
FIG. 4 is a diagram illustrating states of the first power-up control signal, the high voltage start-up signal, the first switch, and the second switch, and voltages of the nodes A and B.
Figure 5:
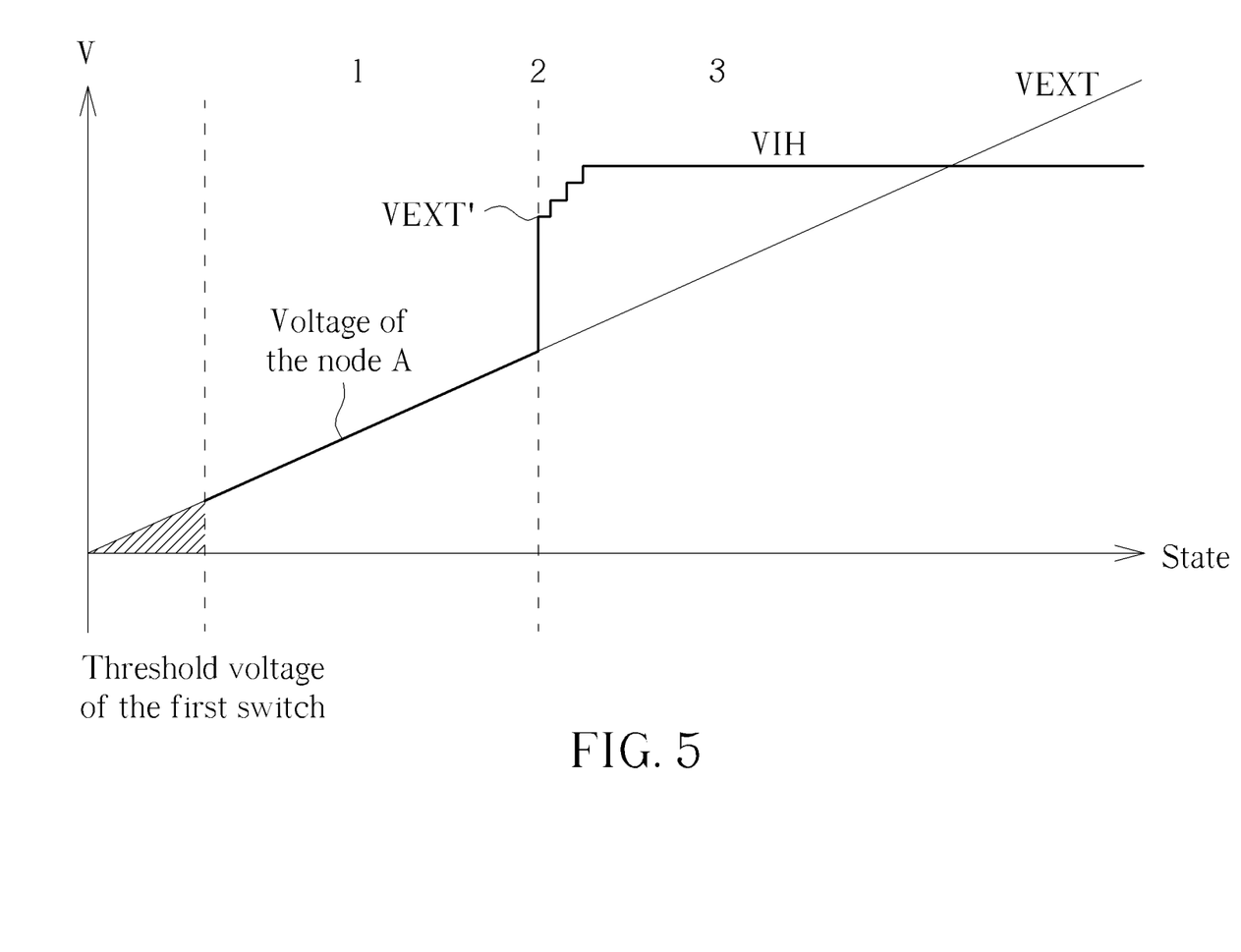
FIG. 5 is a diagram illustrating the voltage of the node A and the external voltage.

Please refer to FIG. 4 and FIG. 5. FIG. 4 is a diagram illustrating states of the first power-up control signal FPCS, the high voltage start-up signal VHES, the first switch 204, and the second switch 206, and voltages of the nodes A and B, and FIG. 5 is a diagram illustrating the voltage of the node A and the external voltage VEXT. As shown in FIG. 2, FIG. 4, and FIG. 5, in state 1, because the high voltage start-up signal VHES is at a low voltage VL, the high voltage generator 208 is turned off according to the high voltage start-up signal VHES. Meanwhile, the power-up control unit 202 generates the first power-up control signal FPCS having a low voltage VL' according to the high voltage start-up signal VHES. Therefore, the first switch 204 and the second switch 206 are turned on according to the first power-up control signal FPCS. Because the first switch 204 and the second switch 206 are turned on, and the high voltage generator 208 is turned off, a voltage of the third terminal of the first switch 204 (the node B) and a voltage of the third terminal of the second switch 206 (the node A) are equal to the external voltage VEXT. As shown in FIG. 2, FIG. 4, and FIG. 5, in state 2 (transient), because the high voltage start-up signal VHES is at a high voltage VH, the high voltage generator 208 is turned on to generate and output an internal high voltage VIH according to the high voltage start-up signal VHES. Meanwhile, the power-up control unit 202 generates the first power-up control signal FPCS having a high voltage VH' according to the high voltage start-up signal VHES. Therefore, the first switch 204 and the second switch 206 are turned off according to the first power-up control signal FPCS. Because the first switch 204 and the second switch 206 are turned off, the voltage of the third terminal of the first switch 204 (the node B) is floating. Because the high voltage generator 208 outputs the internal high voltage VIH, the internal high voltage VIH starts to charge the third terminal of the second switch 206 (the node A). That is to say, a voltage VEXT' of the third terminal of the second switch 206 (the node A) is between the external voltage VEXT and the internal high voltage VIH. As shown in FIG. 2, FIG. 4, and FIG. 5, in state 3, the high voltage start-up signal VHES is still at the high voltage VH, and because the high voltage generator 208 is turned on according to the high voltage start-up signal VHES, the high voltage generator 208 still outputs the internal high voltage VIH, where the first switch 204 and the second switch 206 are still turned off according to the first power-up control signal FPCS. Because the first switch 204 and the second switch 206 are still turned off, the voltage of the third terminal of the first switch 204 (the node B) is floating. Because the high voltage generator 208 still outputs the internal high voltage VIH, the voltage of the third terminal of the second switch 206 (the node A) is equal to the internal high voltage VIH.

In addition, in another embodiment of the present invention, the power-up initial circuit 200 includes the high voltage generator 208. In addition, the present invention is not limited to the states of the power-up control unit 202 in FIG. 2, and the first power-up control signal FPCS and the high voltage start-up signal VHES in FIG. 4. Any configuration in which the power-up control unit, the first power-up control signal, and the high voltage start-up signal can utilize the first switch and the second switch to realize a result in FIG. 5 falls within the scope of the present invention.

Figure 6:
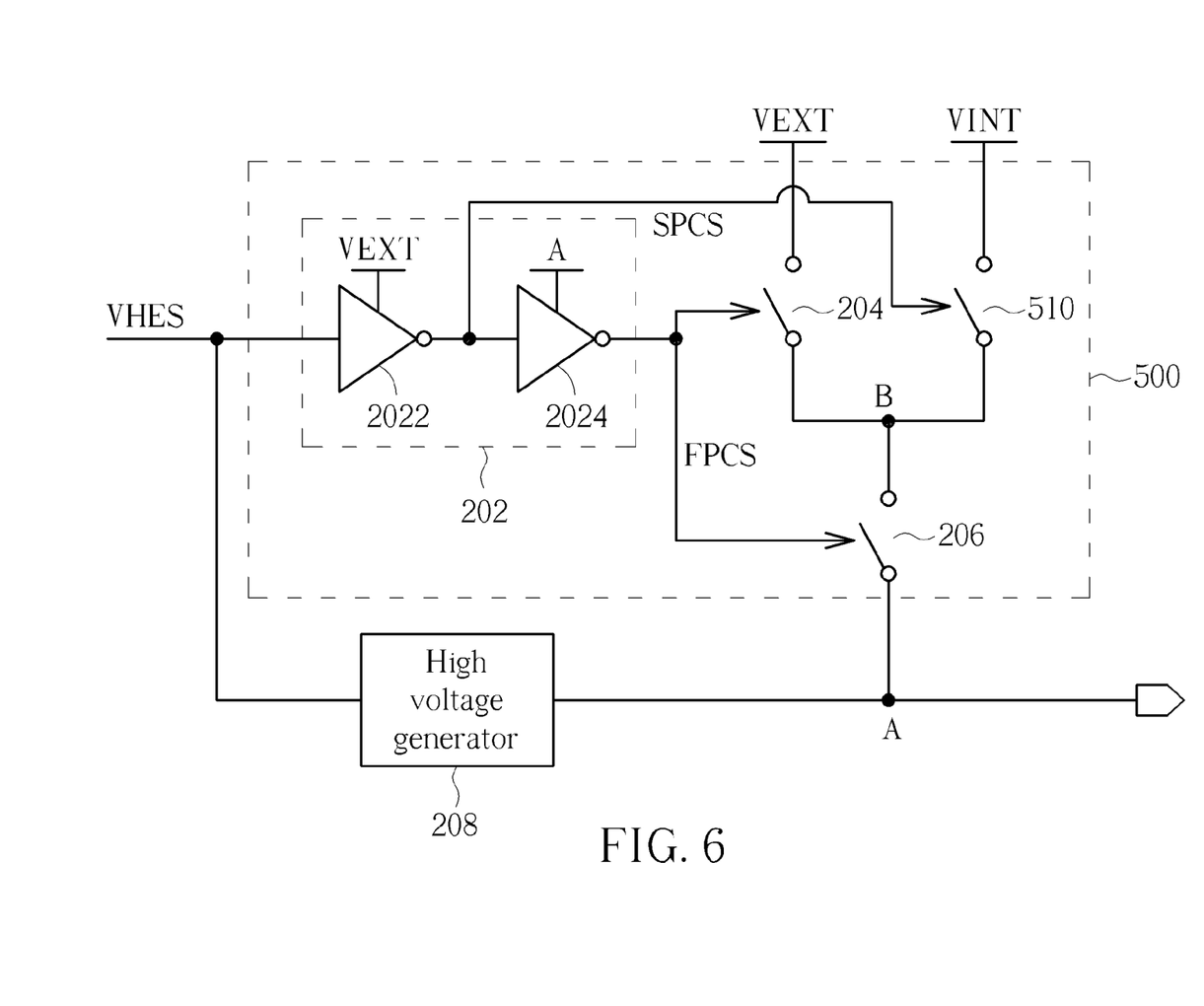
FIG. 6 is a diagram illustrating a power-up initial circuit according to another embodiment.
Figure 7:
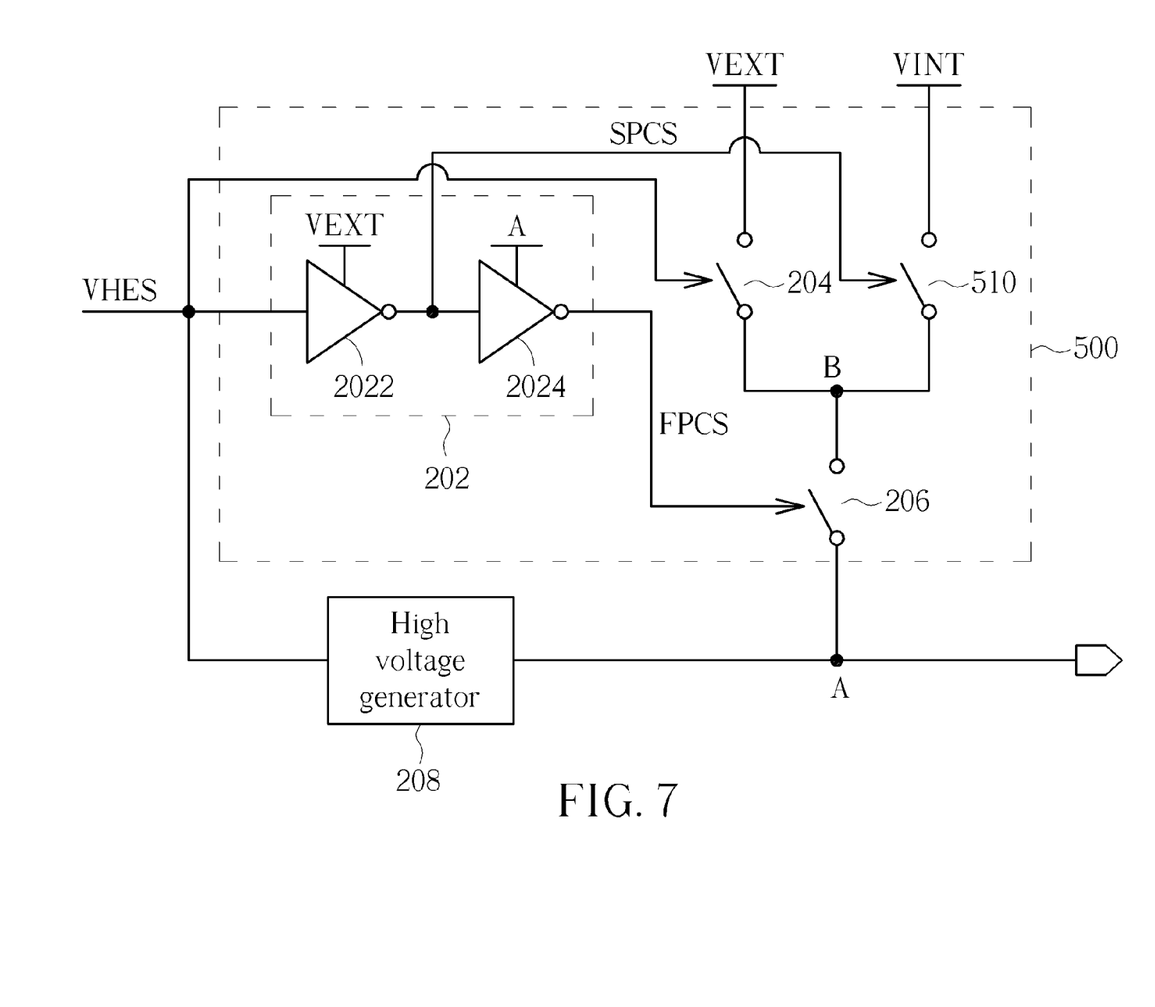
FIG. 7 is a diagram illustrating a power-up initial circuit according to another embodiment.

Please refer to FIG. 6. FIG. 6 is a diagram illustrating a power-up initial circuit 500 according to another embodiment. A difference between the power-up initial circuit 500 and the power-up initial circuit 200 is that the power-up initial circuit 500 further includes a third switch 510. The third switch 510 has a first terminal for receiving an internal voltage VINT, where the internal voltage VINT is lower than the external voltage VEXT, a second terminal coupled to the power-up control unit 202 for receiving the second power-up control signal SPCS generated by the power-up control unit 202, and a third terminal coupled to the third terminal of the first switch 204. The third switch 510 can be a P-type metal-oxide-semiconductor transistor. But, the present invention is not limited to the third switch 510 being a P-type metal-oxide-semiconductor transistor. That is to say, the third switch 510 can also be an N-type metal-oxide-semiconductor transistor or a transmission gate. In addition, the power-up control unit 202, the first switch 204, the second switch 206, and the high voltage generator 208 in FIG. 6 are the same as the power-up control unit 202, the first switch 204, the second switch 206, and the high voltage generator 208 in FIG. 2, so further descriptions thereof are omitted for simplicity. In another embodiment of the present invention (as shown in FIG. 7), the second terminal of the first switch 204 of the power-up initial circuit 500 is coupled to the first terminal of the first inverter 2022 for receiving the high voltage start-up signal VHES.

Figure 8:
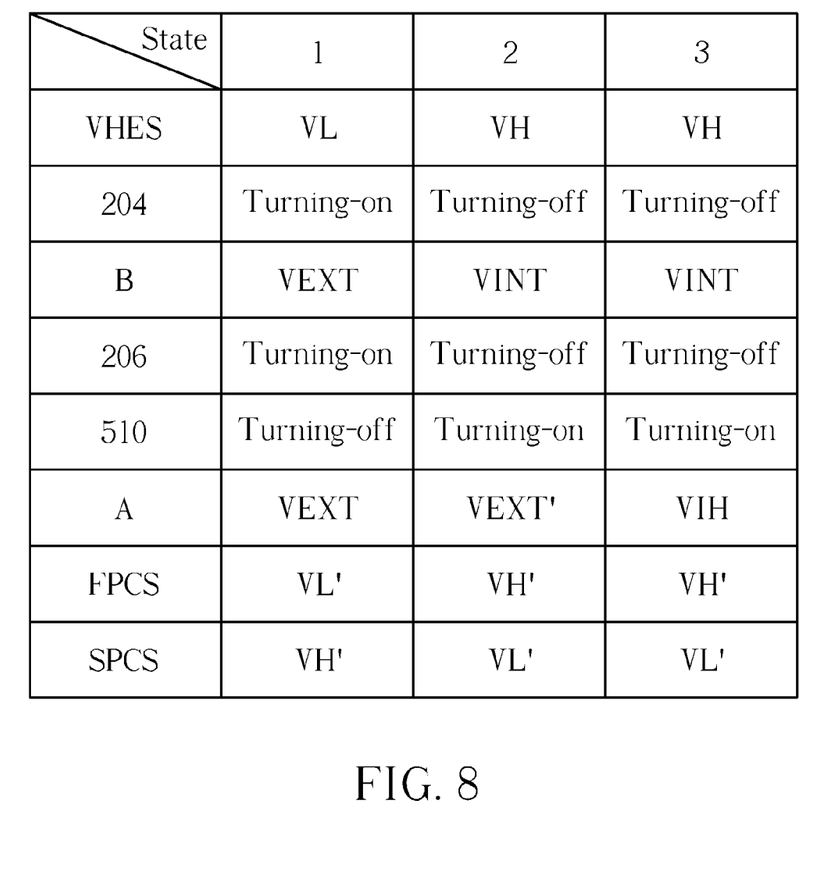
FIG. 8 is a diagram illustrating states of the first power-up control signal, the second power-up control signal, the high voltage start-up signal, the first switch, the second switch, and the third switch, and voltages of the nodes A and B.
Figure 9:
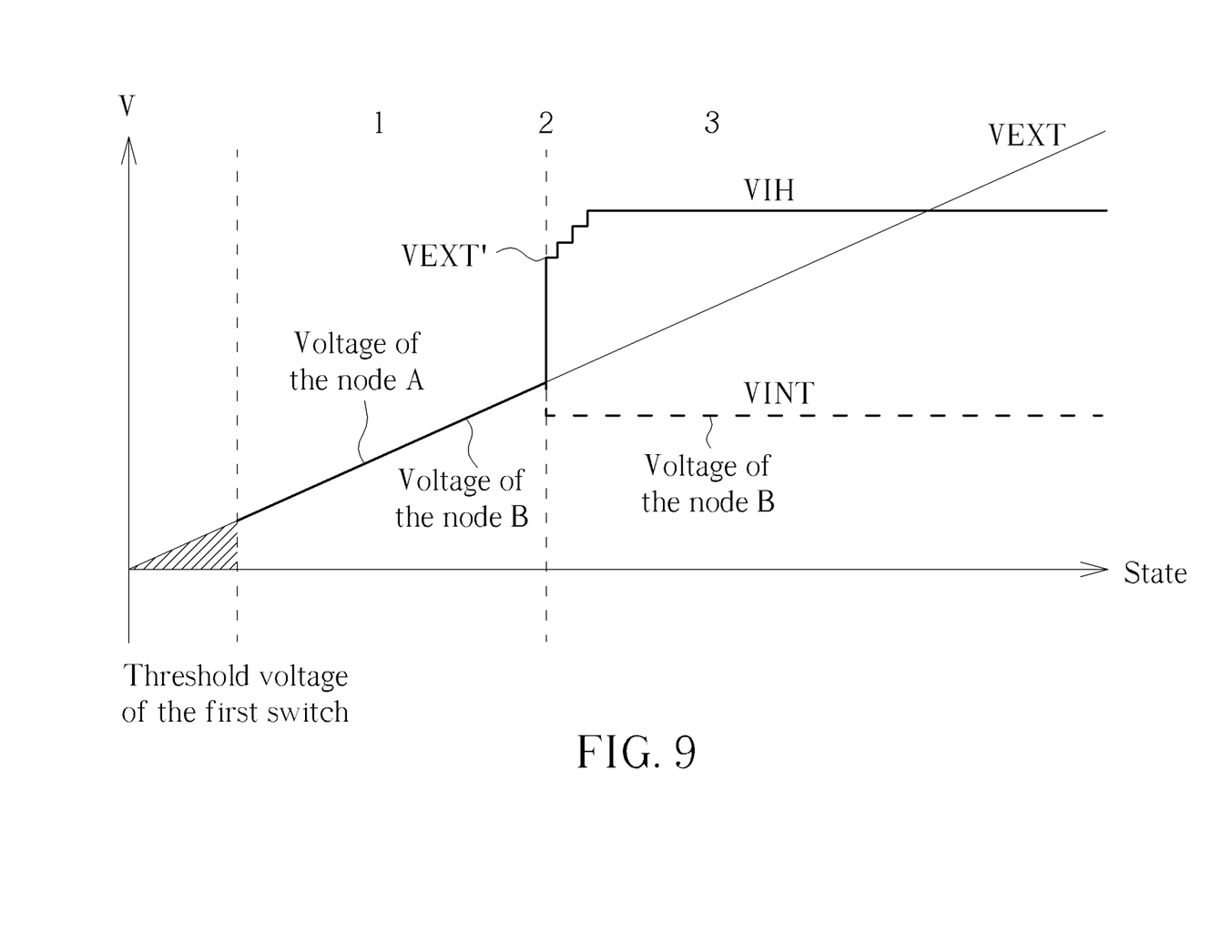
FIG. 9 is a diagram illustrating the voltages of the nodes A and B, the internal voltage, and the external voltage.

Please refer to FIG. 8 and FIG. 9. FIG. 8 is a diagram illustrating states of the first power-up control signal FPCS, the second power-up control signal SPCS, the high voltage start-up signal VHES, the first switch 204, the second switch 206, and the third switch 510, and voltages of the nodes A and B, and FIG. 9 is a diagram illustrating the voltages of the nodes A and B, the internal voltage VINT, and the external voltage VEXT. As shown in FIG. 6, FIG. 8, and FIG. 9, in state 1, because the high voltage start-up signal VHES is at the low voltage VL, the high voltage generator 208 is turned off according to the high voltage start-up signal VHES. Meanwhile, the power-up control unit 202 generates the first power-up control signal FPCS having the low voltage VL' and the second power-up control signal SPCS having the high voltage VH' according to the high voltage start-up signal VHES. Therefore, the first switch 204 and the second switch 206 are turned on according to the first power-up control signal FPCS, and the third switch 510 is turned off according to the second power-up control signal SPCS. Because the first switch 204 and the second switch 206 are turned on, and the high voltage generator 208 is turned off, a voltage of the third terminal of the first switch 204 (the node B) and a voltage of the third terminal of the second switch 206 (the node A) are equal to the external voltage VEXT. As shown in FIG. 6, FIG. 8, and FIG. 9, in state 2 (transient), because the high voltage start-up signal VHES is at the high voltage VH, the high voltage generator 208 is turned on to generate and output the internal high voltage VIH according to the high voltage start-up signal VHES. Meanwhile, the power-up control unit 202 generates the first power-up control signal FPCS having the high voltage VH' and the second power-up control signal SPCS having the low voltage VL' according to the high voltage start-up signal VHES. Therefore, the first switch 204 and the second switch 206 are turned off according to the first power-up control signal FPCS, and the third switch 510 is turned on according to the second power-up control signal SPCS. Because the first switch 204 and the second switch 206 are turned off, and the third switch 510 is turned on, the voltage of the third terminal of the first switch 204 (the node B) is equal to the internal voltage VINT. Because the high voltage generator 208 outputs the internal high voltage VIH, the internal high voltage VIH starts to charge the third terminal of the second switch 206 (the node A). That is to say, a voltage VEXT' of the third terminal of the second switch 206 (the node A) is between the external voltage VEXT and the internal high voltage VIH. As shown in FIG. 6, FIG. 8, and FIG. 9, in state 3, the high voltage start-up signal VHES is still at the high voltage VH, and because the high voltage generator 208 is turned on according to the high voltage start-up signal VHES, the high voltage generator 208 still outputs the internal high voltage VIH, where the first switch 204 and the second switch 206 are still turned off according to the first power-up control signal FPCS and the third switch 510 is still turned on according to the second power-up control signal SPCS. Because the first switch 204 and the second switch 206 are still turned off, the voltage of the third terminal of the first switch 204 (the node B) is still equal to the internal voltage VINT. Because the high voltage generator 208 still outputs the internal high voltage VIH, the voltage of the third terminal of the second switch 206 (the node A) is equal to the internal high voltage VIH.

In addition, in another embodiment of the present invention, the power-up initial circuit 500 includes the high voltage generator 208. In addition, the present invention is not limited to the states of the power-up control unit 202 in FIG. 6, and the first power-up control signal FPCS, the second power-up control signal SPCS, and the high voltage start-up signal VHES in FIG. 8. Any configuration in which the power-up control unit, the first power-up control signal, the second power-up control signal, and the high voltage start-up signal can utilize the first switch, the second switch, and the third switch to realize a result in FIG. 9 falls within the scope of the present invention.

To sum up, the power-up initial circuit utilizes the power-up control unit to determine turning-on and turning-off of the first switch and the second switch, or turning-on and turning-off of the first switch, the second switch, and the third switch, and utilizes turning-on and turning-off of the high voltage generator to control the voltage of the third terminal of the second switch. Therefore, compared to the prior art, a power-up capability of the present invention can not be reduced with decrease of the external voltage (the external voltage is decreased with an advanced metal-oxide-semiconductor transistor process), and the present invention can also not exhibit a side effect or a latch-up effect not wanted by a user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power-up initial circuit, comprising:
   a power-up control unit for receiving a high voltage start-up signal, and generating a first power-up control signal;
   a first switch having a first terminal for receiving an external voltage, a second terminal coupled to the power-up control unit for receiving the first power-up control signal, and a third terminal; and
   a second switch having a first terminal coupled to the third terminal of the first switch, a second terminal coupled to the power-up control unit for receiving the first power-up control signal, and a third terminal for coupling to a high voltage generator;
   wherein the high voltage generator is turned on or off according to the high voltage start-up signal, and potential of the third terminal of the second switch is equal to the external voltage or an internal high voltage according to conditions of turning-on and turning-off of the high voltage generator, the first switch, and the second switch.

2. The power-up initial circuit of claim 1, wherein the high voltage generator is further used for receiving the high voltage start-up signal.

3. The power-up initial circuit of claim 2, wherein when the high voltage start-up signal is at a low voltage, the first switch and the second switch are turned on according to the first power-up control signal, the high voltage generator is turned off according to the high voltage start-up signal, and potential of the third terminal of the first switch and the potential of the third terminal of the second switch are equal to the external voltage.

4. The power-up initial circuit of claim 2, wherein when the high voltage start-up signal is at a high voltage, the first switch and the second switch are turned off according to the first power-up control signal, the high voltage generator is turned on to generate and output the internal high voltage according to the high voltage start-up signal, and the potential of the third terminal of the second switch is equal to the internal high voltage.

5. The power-up initial circuit of claim 1, wherein the first switch and the second switch are P-type metal-oxide-semiconductor transistors.

6. The power-up initial circuit of claim 1, further comprising the high voltage generator.

7. The power-up initial circuit of claim 1, further comprising:
   a third switch having a first terminal for receiving an internal voltage, a second terminal coupled to the power-up control unit for receiving a second power-up control signal generated by the power-up control unit, and a third terminal coupled to the third terminal of the first switch;
   wherein a phase of the second power-up control signal is opposite to a phase of the first power-up control signal.

8. The power-up initial circuit of claim 7, wherein the high voltage generator is further used for receiving the high voltage start-up signal.

9. The power-up initial circuit of claim 8, wherein when the high voltage start-up signal is at a low voltage, the first switch and the second switch are turned on according to the first power-up control signal, the third switch is turned off according to the second power-up control signal, the high voltage generator is turned off according to the high voltage start-up signal, and potential of the third terminal of the first switch and the potential of the third terminal of the second switch are equal to the external voltage.

10. The power-up initial circuit of claim 8, wherein when the high voltage start-up signal is at a high voltage, the first switch and the second switch are turned off according to the first power-up control signal, the third switch is turned on according to the second power-up control signal, the high voltage generator is turned on to generate and output the internal high voltage according to the high voltage start-up signal, and potential of the third terminal of the first switch is equal to the internal voltage and the potential of the third terminal of the second switch is equal to the internal high voltage.

11. The power-up initial circuit of claim 8, wherein the power-up control unit comprises:
   a first inverter having a first terminal for receiving the high voltage start-up signal, and a second terminal coupled to the second terminal of the third switch for outputting the second power-up control signal, wherein a phase of the second power-up control signal is opposite to a phase of the high voltage start-up signal; and a second inverter having a first terminal coupled to the second terminal of the first inverter for receiving the second power-up control signal, and a second terminal coupled to the second terminal of the first switch and the second terminal of the second switch for outputting the first power-up control signal.

12. The power-up initial circuit of claim 7, wherein the third switch is a P-type metal-oxide-semiconductor transistor.

13. The power-up initial circuit of claim 11, wherein a voltage source of the first inverter is the external voltage, and a voltage source of the second inverter is the internal high voltage.

14. The power-up initial circuit of claim 1, wherein the power-up control unit comprises:

a first inverter having a first terminal for receiving the high voltage start-up signal, and a second terminal; and a second inverter having a first terminal coupled to the second terminal of the first inverter, and a second terminal coupled to the second terminal of the first switch and the second terminal of the second switch for outputting the first power-up control signal.

15. The power-up initial circuit of claim 14, wherein a voltage source of the first inverter is the external voltage, and a voltage source of the second inverter is the internal high voltage.

16. The power-up initial circuit of claim 7, further comprising the high voltage generator.

17. A power-up initial circuit, comprising:

a power-up control unit for receiving a high voltage start-up signal, and generating a first power-up control signal;

a first switch having a first terminal for receiving an external voltage, a second terminal coupled to the power-up control unit for receiving the first power-up control signal, and a third terminal; and a second switch having a first terminal coupled to the third terminal of the first switch, a second terminal coupled to the power-up control unit for receiving the first power-up control signal, and a third terminal for coupling to a high voltage generator;

wherein the high voltage generator is turned on or off according to the high voltage start-up signal, and potential of the third terminal of the second switch is equal to the external voltage when turning off the high voltage generator caused by the high voltage start-up signal.

* * * * *